US010312611B2

United States Patent
Shah et al.

(10) Patent No.: US 10,312,611 B2
(45) Date of Patent: Jun. 4, 2019

(54) CONNECTOR FOR USE WITH PRINTED CIRCUIT BOARD

(71) Applicant: Microsoft Technology Licensing, LLC, Redmond, WA (US)

(72) Inventors: Akash Atul Shah, Seattle, WA (US); Kurt David Wrisley, Edmonds, WA (US); Hua Wang, Sammamish, WA (US); Todd David Pleake, Sammamish, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 39 days.

(21) Appl. No.: 15/601,870

(22) Filed: May 22, 2017

(65) Prior Publication Data

US 2018/0287278 A1    Oct. 4, 2018

Related U.S. Application Data

(60) Provisional application No. 62/479,240, filed on Mar. 30, 2017.

(51) Int. Cl.
*H01R 12/59* (2011.01)
*H01R 12/72* (2011.01)
(Continued)

(52) U.S. Cl.
CPC ......... *H01R 12/592* (2013.01); *H01R 12/714* (2013.01); *H01R 12/724* (2013.01);
(Continued)

(58) Field of Classification Search
CPC ............... H01R 12/592; H01R 12/728; H01R 13/6658; H01R 13/66
(Continued)

(56) References Cited

U.S. PATENT DOCUMENTS 5,883,787 A    3/1999    Reier
6,699,054 B1   3/2004    Critelli
(Continued)

FOREIGN PATENT DOCUMENTS

| CN | 102210063 A | 10/2011 |
|----|-------------|---------|
| DE | 20010669 U1 | 10/2001 |
| EP | 2922149 A1  | 9/2015  |

OTHER PUBLICATIONS

"Mobile Battery Connectors", http://www.mouser.com/pdfdocs/QuickReferenceGuide.pdf, Retrieved on: Mar. 16, 2017, 8 pages.
(Continued)

*Primary Examiner* — Abdullah A Riyami
*Assistant Examiner* — Nader J Alhawamdeh
(74) *Attorney, Agent, or Firm* — Alleman Hall Creasman & Tuttle LLP

(57) ABSTRACT

A floating connector assembly device is provided. An electronic component is mounted directly or indirectly to a chassis of an electronic device. At least one conductive contact spring is mounted to the electronic component and configured to electrically couple to the electronic component. A printed circuit board having a fixed end and a free end with an electrical contact positioned between the two ends is positioned against the conductive contact spring, the contact spring being biased so that a contacting portion of the contact spring contacts the electrical contact to form an electrical connection. The electrical connection is maintained during relative movement of the conductive contact spring and the electrical contact of the printed circuit board by a bias force of the conductive contact spring.

18 Claims, 11 Drawing Sheets

(51) Int. Cl.
   *H01R 13/15*    (2006.01)
   *H01R 13/635*   (2006.01)
   *H05K 7/04*     (2006.01)
   *H05K 7/10*     (2006.01)
   *H01R 12/71*    (2011.01)
   *H01R 13/24*    (2006.01)
   *H01R 24/58*    (2011.01)

(52) U.S. Cl.
   CPC ........... *H01R 12/728* (2013.01); *H01R 13/15* (2013.01); *H01R 13/635* (2013.01); *H05K 7/04* (2013.01); *H05K 7/1069* (2013.01); *H01R 13/2442* (2013.01); *H01R 24/58* (2013.01); *H05K 2201/10189* (2013.01)

(58) Field of Classification Search
   USPC .......................................................... 439/79
   See application file for complete search history.

(56) References Cited

U.S. PATENT DOCUMENTS

| | | | |
|---|---|---|---|
| 7,065,470 B2* | 6/2006 | Seel | H01R 13/6658 702/168 |
| 7,128,584 B2* | 10/2006 | Gazelot | H01R 13/518 439/95 |
| 7,238,059 B1 | 7/2007 | Wu | |
| 7,766,668 B1 | 8/2010 | Bishop | |
| 8,517,777 B2* | 8/2013 | Haans | H01R 12/57 439/816 |
| 9,337,883 B1* | 5/2016 | Wang | H04B 1/3888 |
| 2004/0038593 A1 | 2/2004 | Siddiqui | |
| 2007/0111607 A1* | 5/2007 | Zhu | H01R 24/58 439/669 |
| 2014/0055966 A1 | 2/2014 | Tan et al. | |
| 2014/0113491 A1* | 4/2014 | Tsao | H01R 12/79 439/620.15 |
| 2015/0263443 A1* | 9/2015 | Zhang | H01R 12/72 439/78 |
| 2016/0149607 A1* | 5/2016 | Wang | H04B 1/3888 455/575.8 |
| 2016/0233037 A1* | 8/2016 | Lee | H01H 13/705 |

OTHER PUBLICATIONS

"High Performance Board-to-Board Connectors", https://www.hirose.co.kr/Upload/FunctionMAX_HP_E.pdf, Published on: Mar. 2016, 12 pages.

"International Search Report and Written Opinion Issued in PCT Application No. PCT/US2018/023904", dated Jun. 7, 2018, 14 Pages.

* cited by examiner

CONNECTOR FOR USE WITH PRINTED CIRCUIT BOARD

CROSS REFERENCE TO RELATED APPLICATIONS

This application claims priority to U.S. Provisional Patent Application No. 62/479,240 filed Mar. 30, 2017, the entirety of which is hereby incorporated herein by reference.

BACKGROUND

As electronic devices evolve, so does the problem of creating compact and durable designs for forming multiple connections with printed circuit boards (PCBs). Connector alignment is a challenge during manufacturing and assembly of electronic devices. Connectors are generally soldered to a printed circuit board to maintain electrical contact and provide strain relief. However, several drawbacks exist with soldering multiple connections in this manner. First, soldered connections may be bulky and contribute to the overall height of the assembly. Second, soldered connections can wear during repeated use and potentially fail, reducing the useful lifetime of the electronic device. Third, aligning the soldered connectors with openings in the housing can be difficult, due to the slight variations in the precise mounting location of each of the multiple connectors that occur during the manufacturing and assembly process. Precisely aligning other components mounted to the printed circuit board can be similarly problematic. To address this, some prior approaches have included oversized holes in the housing of the electronic device, to provide tolerance for the mounting of the connectors within those holes. However, large holes can undesirably increase the overall size of the device and also have an undesirable external appearance, reducing consumer demand for the electronic device. Adopting tight tolerances for such connections has the drawback of driving up manufacturing costs.

SUMMARY

A connector assembly in an electronic device is provided. An electronic component may be mounted directly or indirectly to a chassis of the electronic device. At least one conductive contact spring may be mounted to the electronic component and configured to electrically couple to the electronic component. A printed circuit board having a fixed end and a free end may have an electrical contact positioned between the fixed and free ends. The conductive contact spring may be biased so that a contacting portion of the conductive contact spring contacts the electrical contact and forms an electrical connection. The electrical connection may be maintained during relative movement of the conductive contact spring and the electrical contact of the printed circuit board by a bias force of the conductive contact spring.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
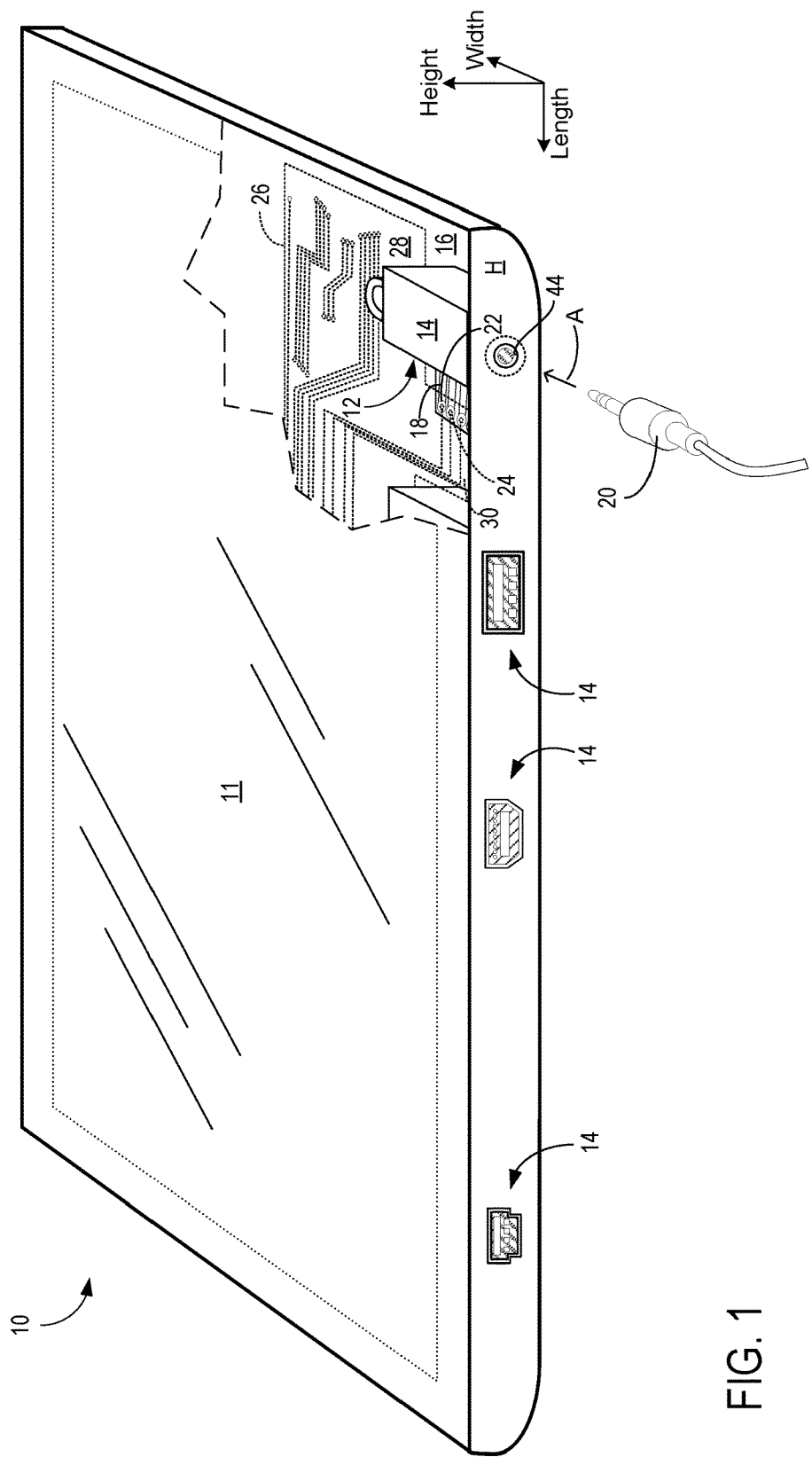
FIG. 1 is an illustration of a connector assembly in an electronic device, including a connector receptacle for a connector plug, conductive contact springs, and a printed circuit board.

A mechanism for providing a floating connection in a floating connector assembly 12 in an electronic device 10 is provided. FIG. 1 displays a floating connector assembly 12 operationally coupled to an electronic device 10. The floating connector assembly 12 may include an electronic component, which may be a connector receptacle 14, one or more conductive contact springs 18, and at least one printed circuit board 26. While the electronic component is illustrated and described herein as a connector receptacle 14, it will be appreciated that other components, such as a camera, camera lens, light sensor, speaker, microphone, button, inertial motion unit, accelerometer, gyroscope, etc. may be mounted in the manner described herein, which can benefit from positioning relative to the chassis 16 with a high degree of precision.

The connector receptacle 14 may be mounted directly or indirectly to a chassis 16 of the electronic device 10. Typically, the receptacle 14 is mounted directly to the chassis 16 to reduce the overall height of the assembly, and if an intermediate component is provided between the chassis and the receptacle it is made to be thin to keep the overall height as small as possible. Notably, the receptacle 14 is not mounted on the printed circuit board 26. The receptacle is typically mounted with an opening end fitted within an opening 44 in the housing H of the electronic device 10. It will be appreciated that the floating connector assembly 12 being mounted directly to the chassis can be positioned with tight tolerance relative to opening 44. This enables opening 44 to be smaller than it would be if a high tolerance were allowed (e.g., smaller than the higher tolerance circle for the opening shown in FIG. 1). A tighter tolerance enables the width of the receptacle 14 housing to be narrower. The walls of the receptacle may be formed to be approximately 0.25 mm or less in thickness in one implementation.

At least one conductive contact spring 18 may be mounted to the connector receptacle 14 and configured to electrically couple to a connector plug 20 inserted in the connector receptacle 14. The conductive contact spring 18 may be mounted on a side of the receptacle and extend away from the receptacle 14 in a direction that is perpendicular to the axis of insertion A of the receptacle. Alternatively, the contact spring 18 may extend from the mounted location on the receptacle 14 in any direction as required by placement of the printed circuit board 26 or to accommodate other components. In the depicted implementation, the connector plug 20 is an audio plug, however the connector plug 20 may be an appropriate plug for a UNIVERSAL SERIAL BUS receptacle, MINI DISPLAYPORT receptacle, FIREWIRE receptacle, Ethernet receptacle, HDMI receptacle, SURFACE CONNECT receptacle, or other customer-specific port implementations in the electronic device 10. In the depicted electronic device 10, a plurality of connector receptacles 14 for a plurality of connector plugs 20 are provided, although only a single receptacle 14 may be provided in other implementations.

Figure 2:
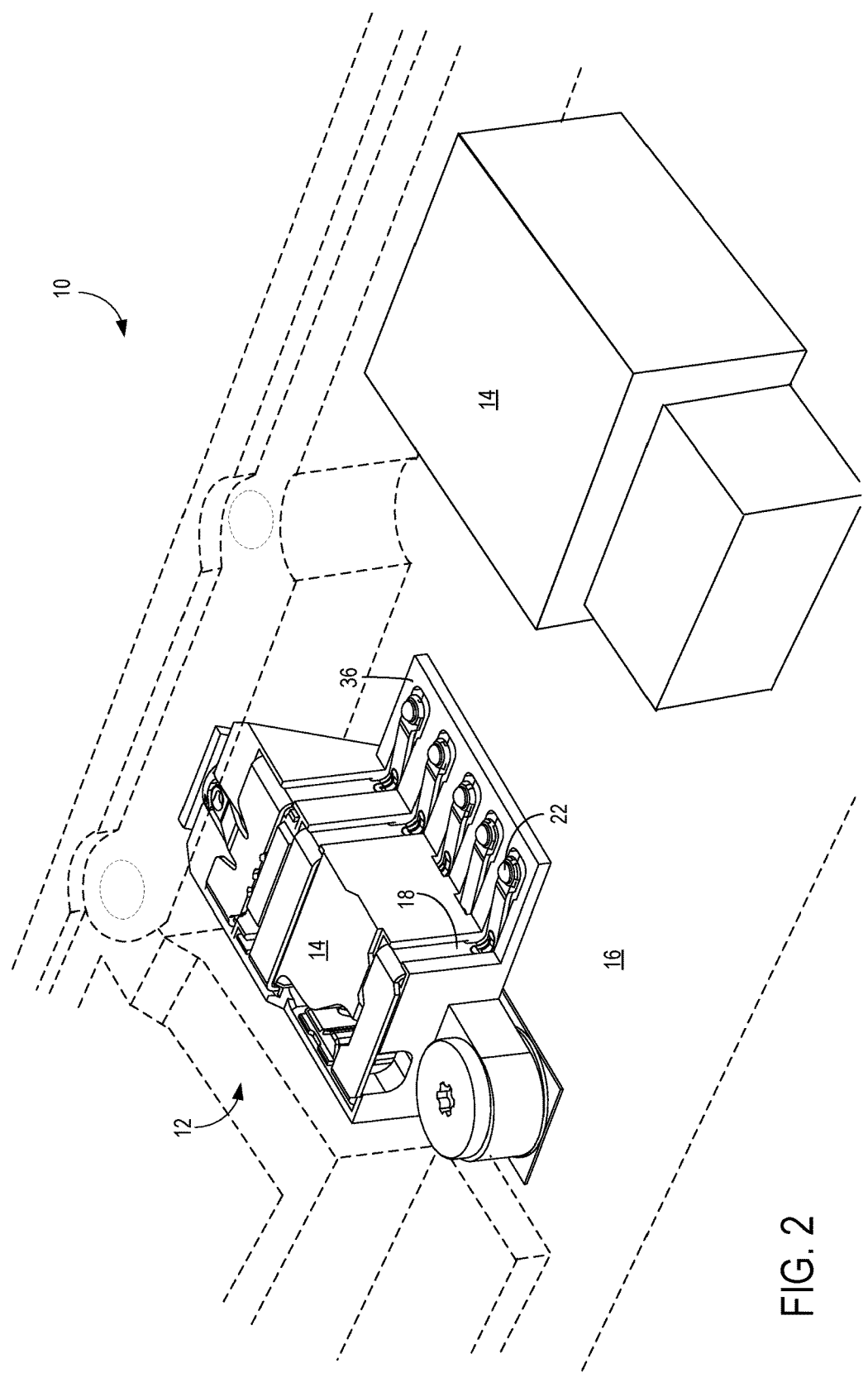
FIG. 2 depicts the connector receptacle with the conductive contact springs mounted to the chassis of the electronic device.

FIG. 2 exhibits one connector receptacle 14 mounted to the chassis 16 of the electronic device 10, with an additional connector receptacle 14 mounted to the chassis 16. One potential advantage of the floating connector assembly 12 is that multiple connections may be aligned to the printed circuit board 26 without compromising the alignment of any one connection via the conductive contact springs 18, the connector receptacle 14, and connector plug 20. This may be made possible by biasing the conductive contact spring 18 to the printed circuit board 26 and allowing relative movement between the two while maintaining an electrical connection, as described below.

Figure 3:
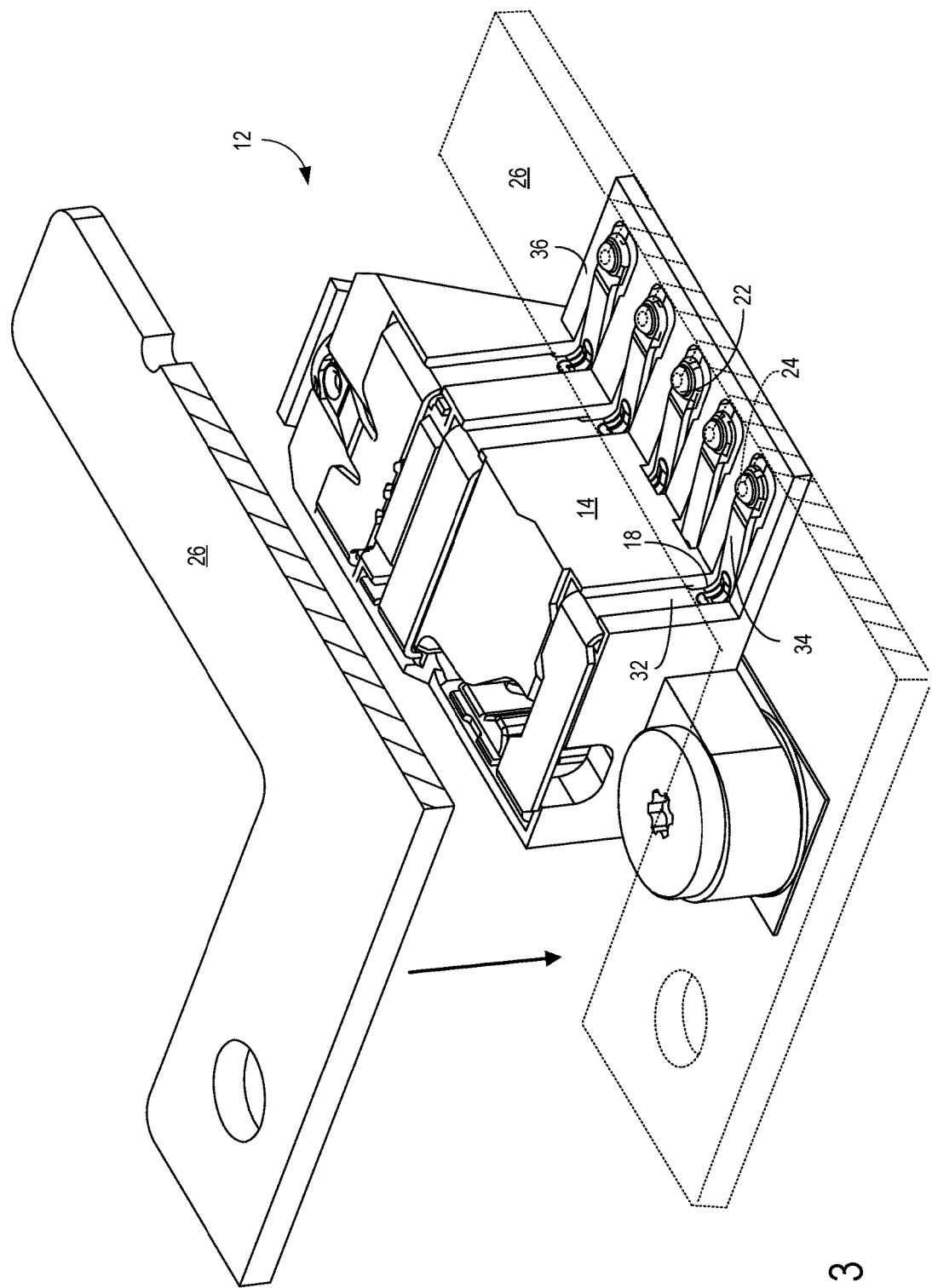
FIG. 3 details the connector assembly and printed circuit board.
Figure 4:
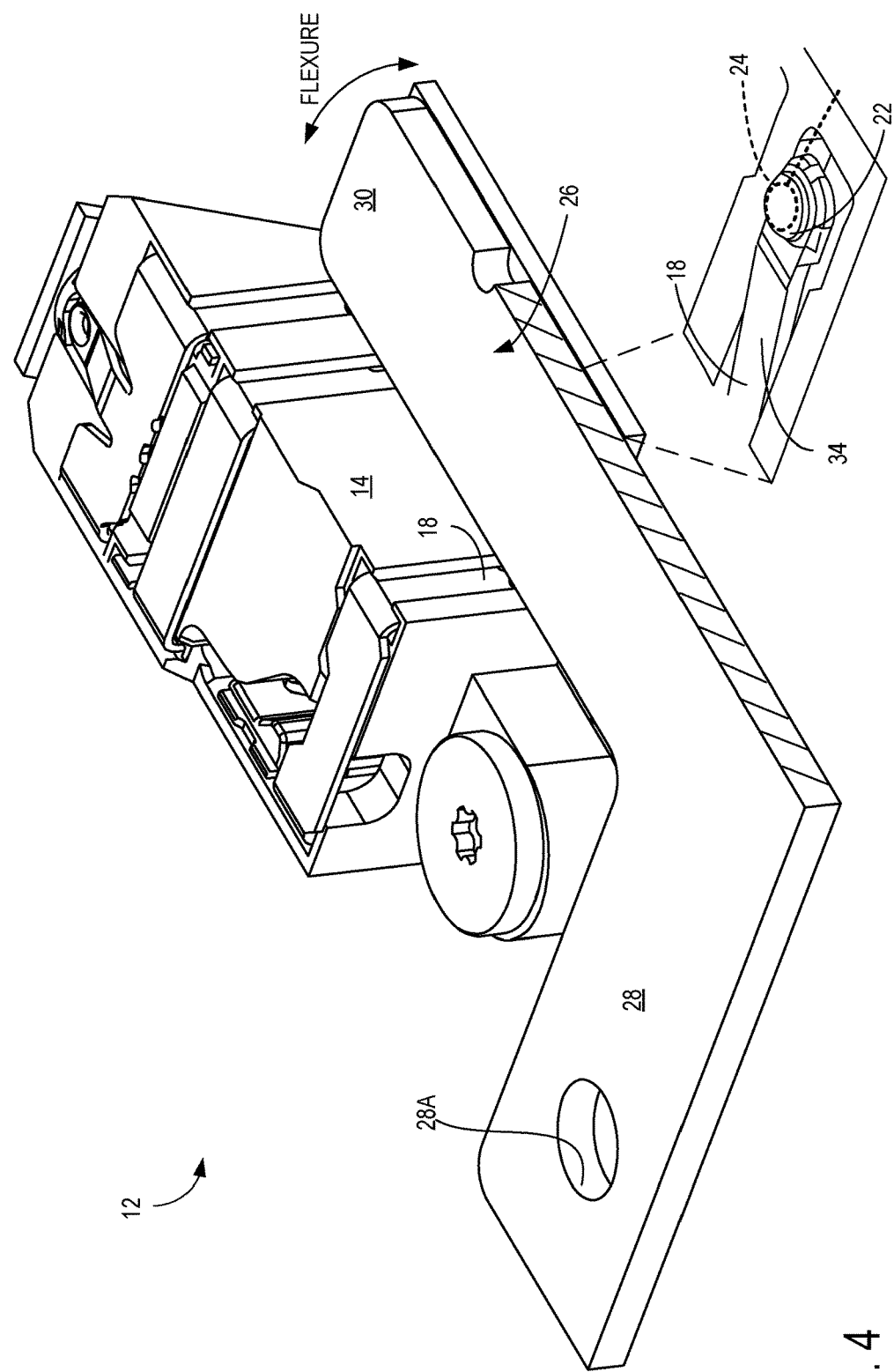
FIG. 4 illustrates the connector assembly with an electrical connection formed between the conductive contact springs and the printed circuit board.

The conductive contact spring 18 may be biased so that a contacting portion 22 of the conductive contact spring 18 contacts an electrical contact 24 on the printed circuit board 26 to form an electrical connection, as shown in FIGS. 3-4. The printed circuit board 26 may have a fixed end 28 and a free end 30 with the electrical contact 24 positioned at a location between the ends, also shown in FIG. 4. It will be appreciated that the printed circuit board is mounted via a fastener (see FIG. 6) extending through a mounting hole 28A to chassis 16, fixing the fixed end 28, and that a gap is provided between the underside of the free end 16 of the printed circuit board and the top side of a tray 36 of the receptacle (see gap 28A in FIG. 6), allowing for upward and downward movement of the free end 28 with flexure of the printed circuit board under external forces such as vibrations or drops of the electronic device. Even under such conditions, the electrical connection may be maintained during relative movement of the conductive contact spring 18 and the electrical contact 24 of the printed circuit board 26 by a bias force of the conductive contact spring 18, which acts to bias the contact spring 18 upwardly against the electrical contact 24 on the underside of the printed circuit board.

In this implementation, the printed circuit board 26 may be placed in a horizontal plane extending in the length and width directions of the electronic device, parallel to a display 11 of the electronic device. The connector receptacle 14 may be assembled directly into the chassis 16 with a distal end of the conductive contact spring 18 angled upward relative to the chassis 16 and the printed circuit board 26, the conductive contact spring 18 contacting the underside of the printed circuit board 26, as viewed in FIGS. 3-10. The conductive contact spring 18 may include a proximate portion 32 that extends substantially orthogonally to a distal portion 34 and may be mounted at a proximal end to the housing of the connector receptacle 14, as shown in FIG. 3. The distal portion 34 may extend horizontally away from the housing of the connector receptacle 14 and toward the electrical contact 24, as shown in FIGS. 3-6. Although substantially orthogonal to each other, the distal portion 34 is angled upward such that it interferes with the nominal position of the printed circuit board 26 by between 5-70% of the printed circuit board thickness. Thus, in the depicted embodiment, the end of the distal portion 34 is pressed upon by the printed circuit board 26 so that the end of the distal portion 34 is deflected about 0.5 mm due to the interference.

The free end 30 of the printed circuit board 26 may be configured to flex in a direction orthogonal to the horizontal plane when the electronic device 10 is exposed to the influence of external forces, as shown in FIG. 4. The contacting portion 22 of the conductive contact spring 18 may be biased to follow the movement of the electrical contact 24 of the printed circuit board 26 during flexure of the printed circuit board 26. It will be appreciated that the electrical contacts 24 on the printed circuit board 26 may be oversized pads so as to allow for the continuous maintenance of the electrical connection. Small pads or contact points that are reduced in size may result in the absence or intermittency of electrical contact ultimately stemming from manufacturing or assembly tolerances. Vibration, drop, or other disturbances may therefore result in a break of the electrical connection. Using oversized pads or an alternatively larger configuration for the electrical contacts 24 may meet functional requirements as well as cosmetic concerns.

The range of travel of the electrical connection during flexure of the printed circuit board 26 may be 0-3 mm, and in the depicted implementation, is at a maximum 0.5 mm. A potential advantage of this configuration is that direct, reliable electrical contact is established between the connector plug 20 and the printed circuit board 26 over extended usage of the electronic device 10. This reliable contact may be accomplished without the use of soldering, supporting foam, additional supports, or additional structure on or near the conductive contact springs 18 and the printed circuit board 26. Further, this configuration has the advantage of reducing overall height of the electronic device 10 by avoiding the provision of springs or supports underneath the receptacle 14, for example between the receptacle 14 and chassis 16. Also, this configuration avoids direct mounting of the receptacle 14 to the printed circuit board 26 and a need to provide springs or supports between the printed circuit board 26 and the receptacle 14. Both of these alternative configurations would undesirably add height to the overall height of the device. A minimal amount of interference is present throughout the tolerance and flexure range in the connection between the conductive contact springs 18 and the printed circuit board 26 because of the bias force. Oversized pads for the electrical contacts 24, as described above, may support continuous contact in a planar direction parallel to the printed circuit board 26, perpendicular to the direction of flexure.

It will be appreciated that the composition of the printed circuit board may be modified to achieve a desired maximum deflection of, for example, 1 mm, when subjected to the bias force of, for example, 30 gf, during electrical contact by the contact spring 18. This may be achieved by modifying the internal construction, for example by providing a greater number or thickness of internal copper layers within the printed circuit board. Of course, overall dimensions of the printed circuit board and material choice will also affect strain and deflection. In one particular implementation, the copper layers are provided in a 10-layer stack and the printed circuit board is designed to not exceed the strain limit. In one implementation, the strain limit may be 0.05%, although this limit may vary with printed circuit board thickness, number of layers, coverlay design, and so forth.

The housing of the connector receptacle 14 may be mounted to the chassis 16 of the electronic device 10 on the same side (i.e., an underside of the receptacle 14) as the electrical contact 24 of the printed circuit board 26, which is mounted on an underside of the printed circuit board 26. Regardless of whether the connector receptacle 14 is mounted on a same side as the electrical contact 24, an entire length of the distal portion 34 of the conductive contact spring 18 may be situated on a same side of the printed circuit board 26 as the electrical contact 24. Additionally, the housing of the connector receptacle 14 may include a nonconductive tray 36 extending from a lower portion thereof in the same direction as the springs as shown in FIG. 2; the tray 36 may be provided to protect the contact springs 18 during assembly of the connector into the electronic device 10. The tray 36 may be configured to avoid contact with the printed circuit board 26 during the useful life of the product, i.e., the tray height may be selected so as not to contact the bottom of the printed circuit board even during a maximum estimated flexure of the printed circuit board during use. The proximate portion 32 of the conductive contact spring 18 and the distal portion 34 may meet at a location in a vicinity of a surface of the tray 36, as shown in the implementation displayed in FIG. 3.

Figure 5:
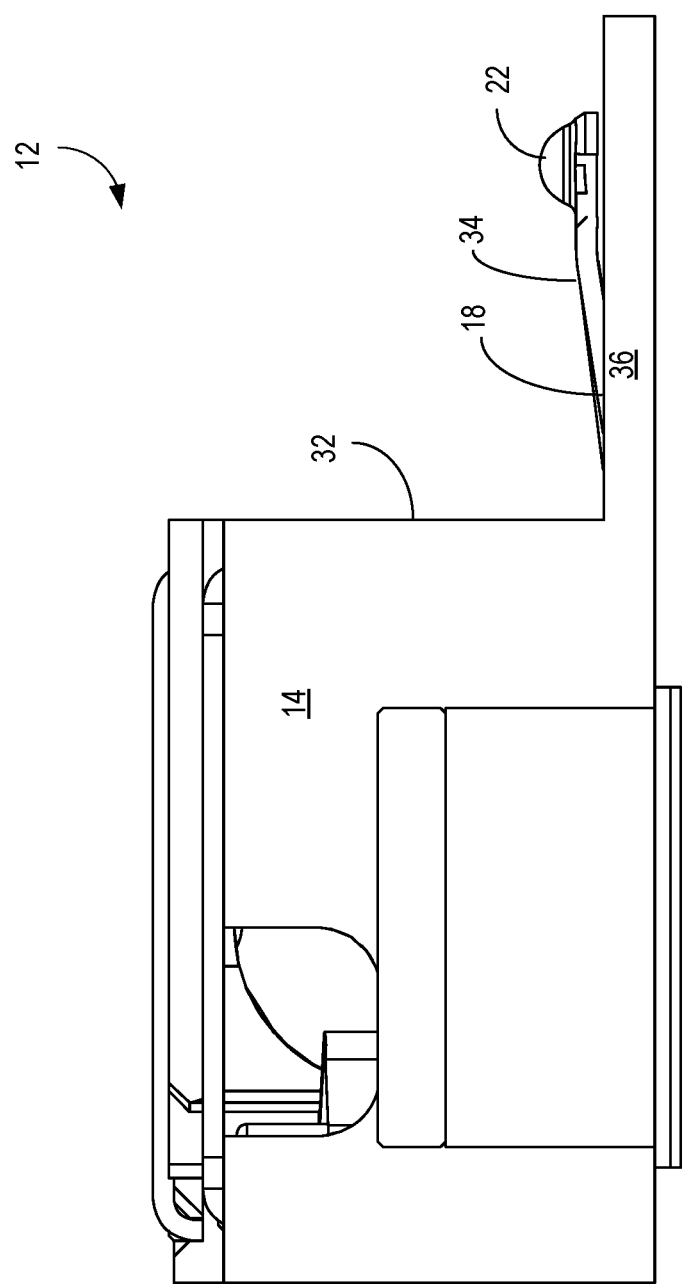
FIG. 5 shows a profile view of the connector assembly, the conductive contact springs visible in elevation above the tray of the connector receptacle housing.

The distal portion 34 of the conductive contact spring 18 may extend freely from the location where the proximate portion 32 and distal portion 34 meet to an elevation vertically away from the surface of the tray 36 such that the distal portion 34 interferes with the nominal position of the printed circuit board 26 by between 5-70% of the printed circuit board thickness. The configuration shown in FIG. 5 depicts the end of the distal portion 34 as raised by about 0.5 mm over the tray 36. A mounting point of the conductive contact spring 18 may be in a plane perpendicular to the plane of the electrical connection and along a proximate portion 32 of the conductive contact spring 18. This configuration is shown in FIG. 3.

Figure 6:
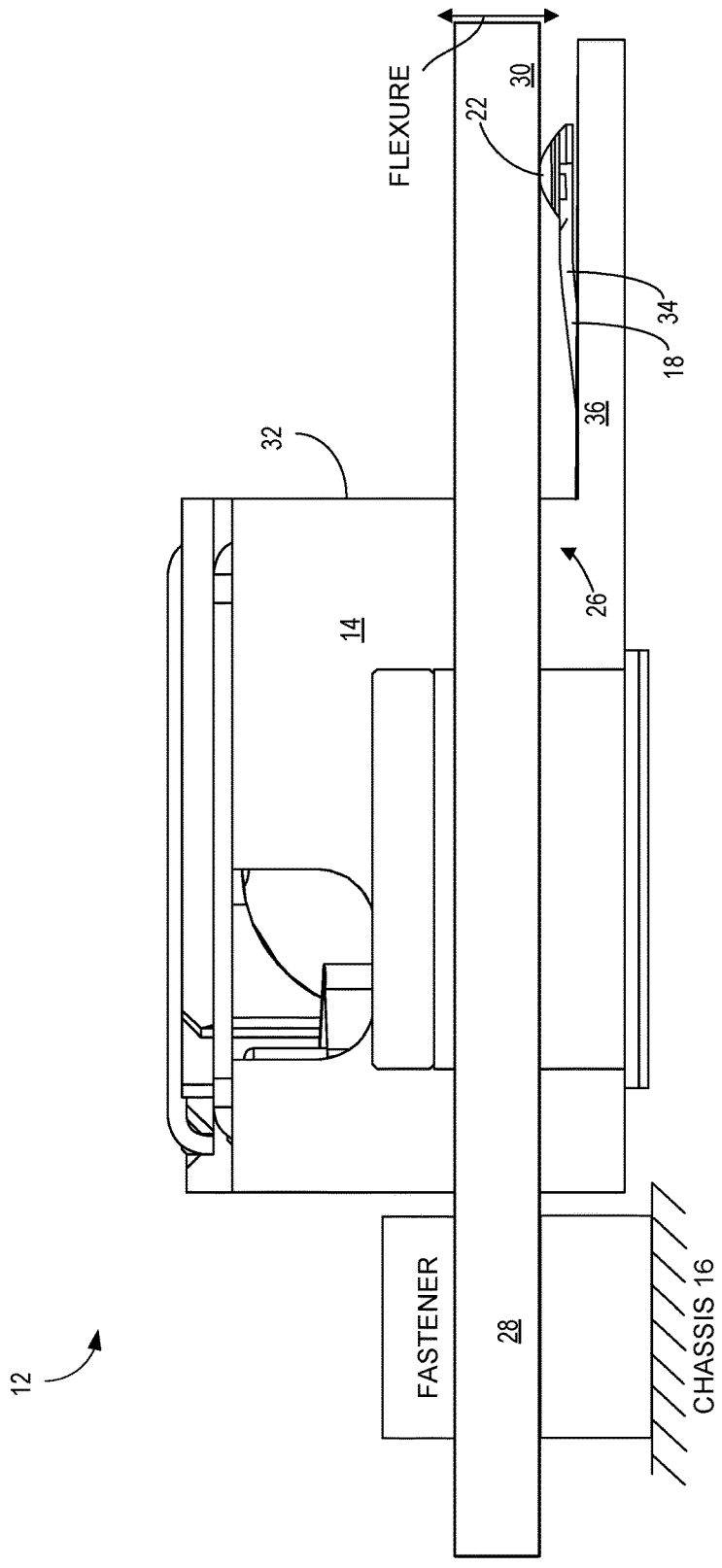
FIG. 6 replicates FIG. 3 with the addition of the printed circuit board, also shown in profile view, and the depiction of an electrical connection established with the conductive contact springs.
Figure 7:
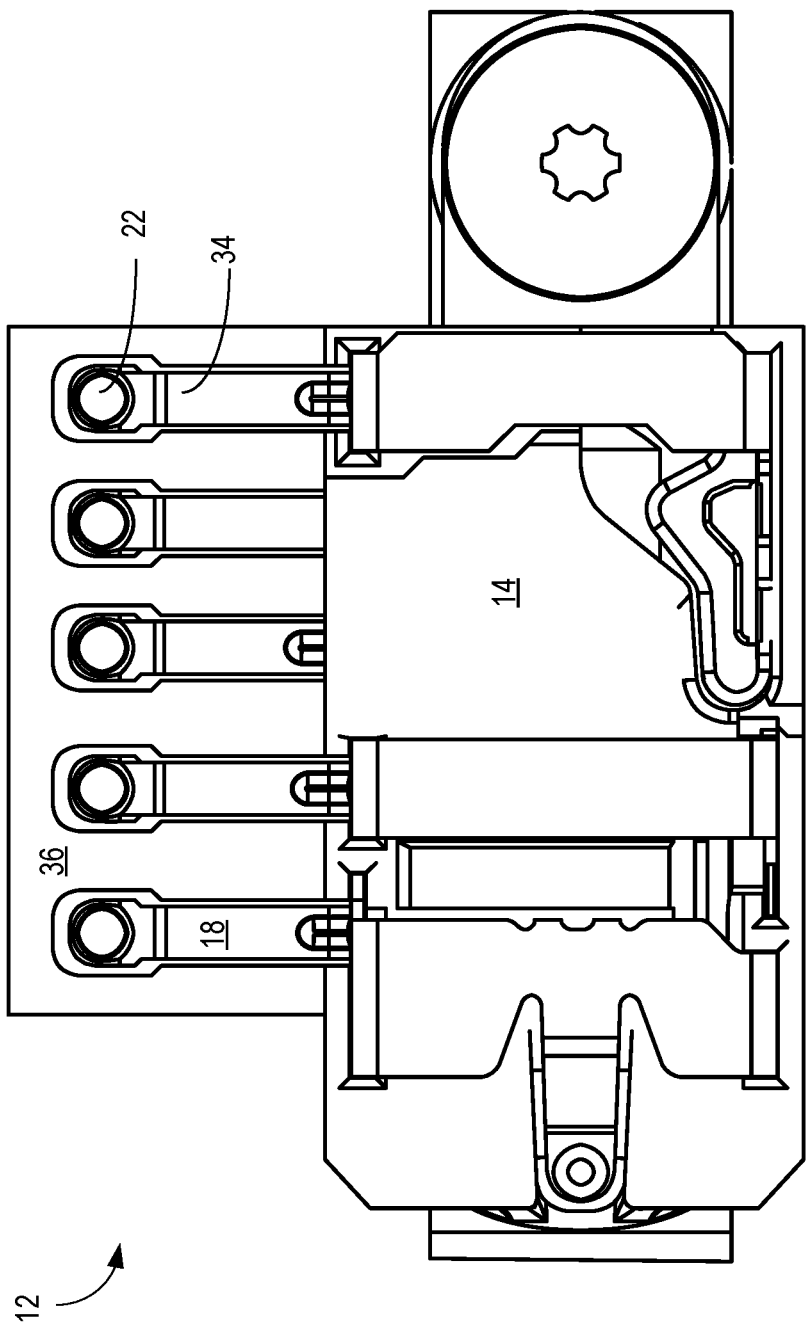
FIG. 7 is an illustration of the connector assembly from a top view.
Figure 8:
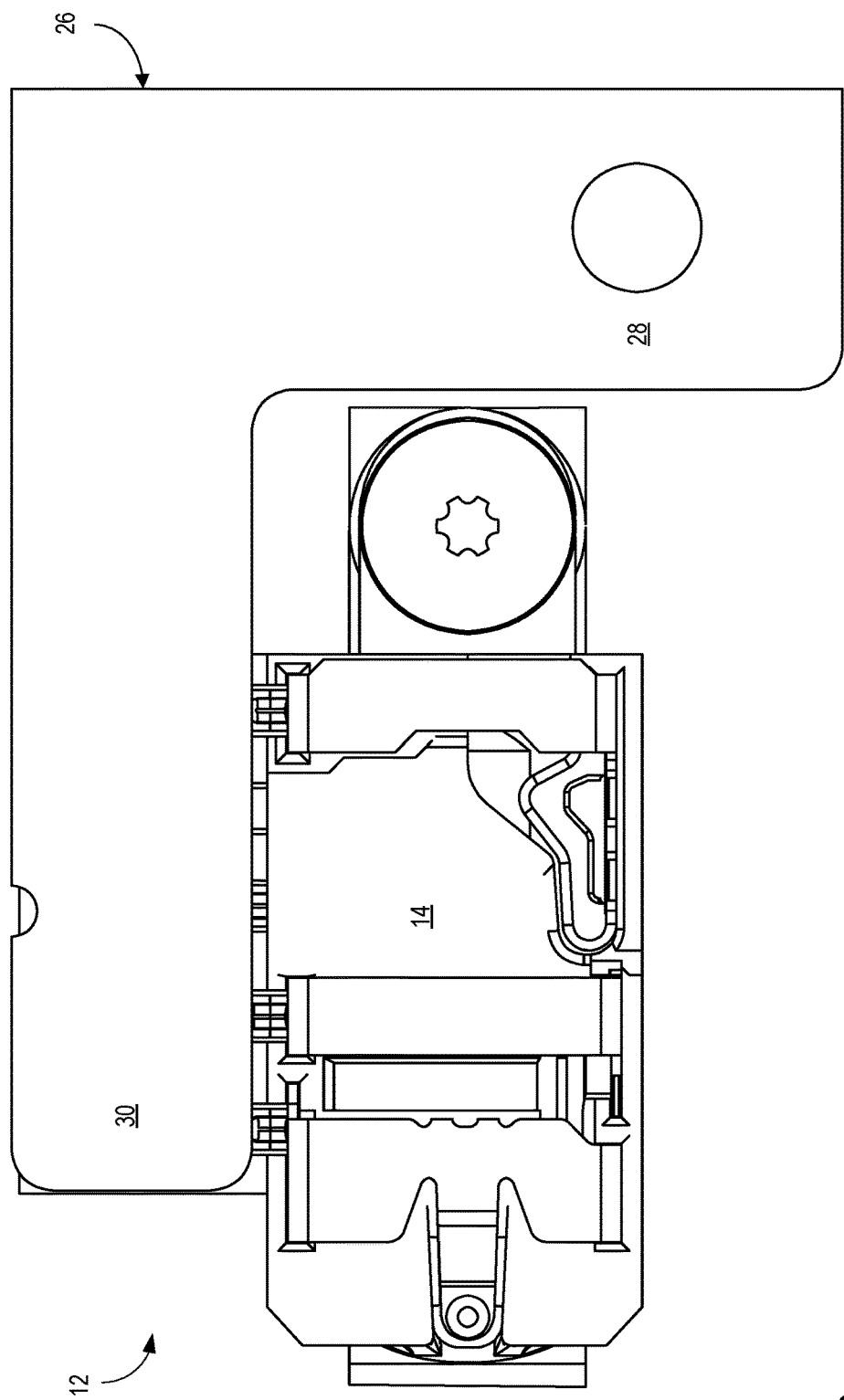
FIG. 8 replicates FIG. 5 with the addition of the printed circuit board making an electrical connection with the conductive contact springs.
Figure 9:
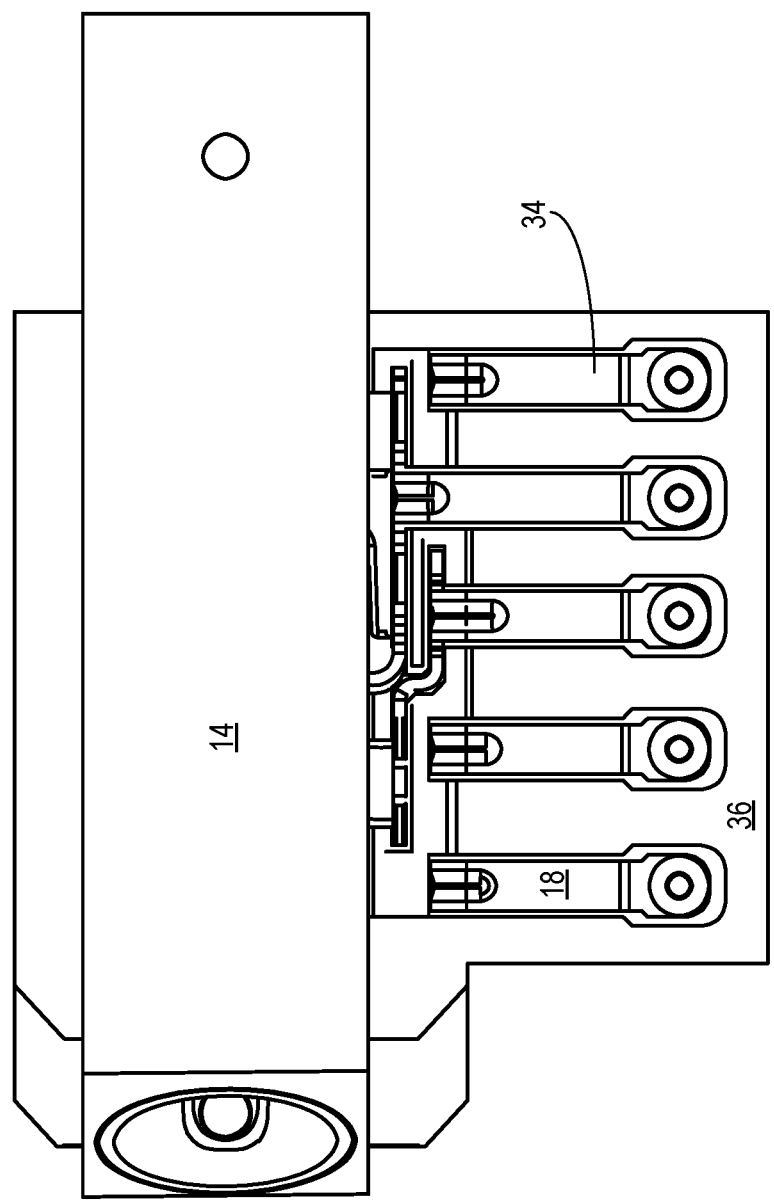
FIG. 9 is an illustration of the connector assembly from the bottom, the underside of the conductive contact springs visible through the tray of the connector receptacle housing.
Figure 10:
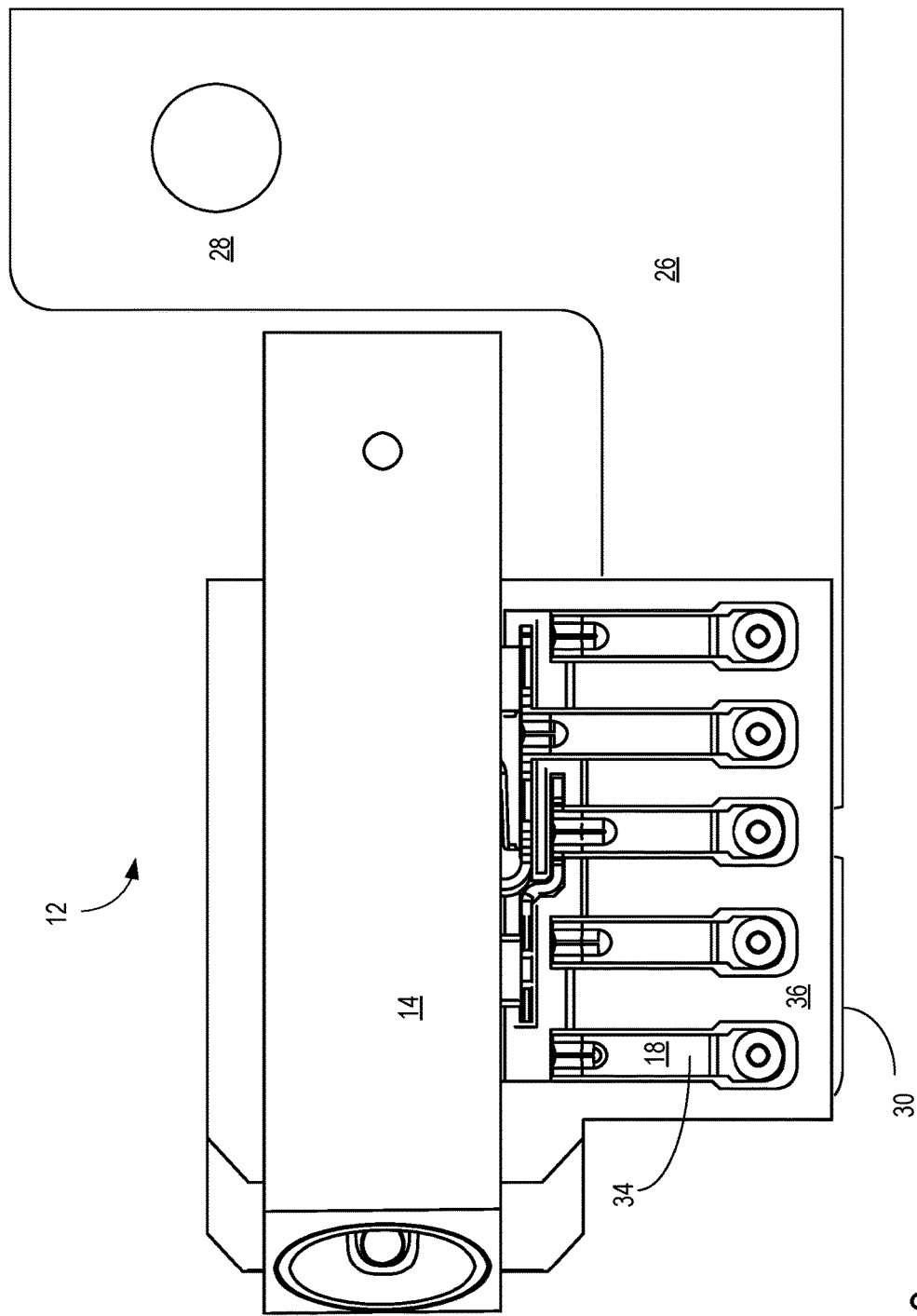
FIG. 10 replicates FIG. 7 with the addition of the printed circuit board making an electrical connection with the conductive contact springs.

When not compressed by the printed circuit board 26, the electrical contact 24 may extend freely away in an elevated configuration as shown in FIG. 5. In a configuration where the contact spring 18 is compressed by the printed circuit board 26, the contacting portion 22 may be biased against a lower surface of the printed circuit board 26. FIG. 6, which illustrates the electrical contact 24 (not shown in profile view) making an electrical connection with the contacting portion 22 of the conductive contact spring 18, exhibits this arrangement. The electrical contact 24 may itself be flush with the printed circuit board 26 or alternatively may stand proud of the printed circuit board 26, and in either configuration the contact spring 18 is designed to interfere with the electrical contact 24 in its nominal position so that the contact spring 18 is biased against the electrical contact 24 during deployment. It will be appreciated that the electrical contact 24 may be oriented either above or below the printed circuit board 26, and therefore the contacting portion 22 may meet the electrical contact 24 either on a lower surface or upper surface of the printed circuit board 26. In either configuration, the conductive contact spring 18 is biased to the printed circuit board 26. The electrical contact 24 and the contacting portion 22 may be additionally gold plated. Plating has the potential advantage of high corrosion resistance. The conductive contact spring 18 may be covered with insulating dielectric grease to provide protection against moisture, humidity, ablation, or other potentially wearing effects. With gold plating, this additional measure is generally not necessary for protection.

The conductive contact spring 18 may exert at least 30 gf of bias force against the electrical contact 24 of the printed circuit board 26 to maintain the electrical connection. In other configurations, the bias force may be between 20 and 100 gf, or more narrowly between 25 and 35 gf, for example. The precise value of the bias force exerted is specific to the design of the connector assembly 12; that is, the value of the bias force may change depending on the type of connector implemented, the number of conductive contact springs 18, and the configuration of the printed circuit board 26, as well as other design considerations. The amount of bias force may be determined through testing such as fine element analysis and signal integrity simulations. The conductive contact spring 18 may be one of a plurality of conductive contact springs 18 depending on the type of connector implemented; the plurality of conductive contact springs 18 may total, for example, one, five, twelve, or twenty. The conductive contact springs 18 may be arranged in rows, in series, or in a configuration appropriate to the space and design of the connector assembly 12 in the electronic device 10. The connector receptacle 14 may have a shape to fit a connector plug 20 appropriate to the desired implementation. For example, the connector plug 20 may be an audio connector jack, a Universal Serial Bus (USB), or a Mini DisplayPort receptacle (mDP), among others.

FIGS. 3, 5, 7, and 9 show the connector receptacle 14 with conductive contact springs 18 and nonconductive tray 36 according to one implementation, each figure demonstrating a different view. FIGS. 4, 6, 8, and 10 show the same representation of the connector receptacle 14 but in electrical contact with the printed circuit board 26 shown in part, each figure a different view of the floating connector assembly 12 according to one implementation. It should be noted that FIGS. 9-10, which display the connector receptacle 14 from underneath, reveal the underside of the conductive contact springs 18 as visible through the tray 36 of the connector receptacle housing.

Figure 11:
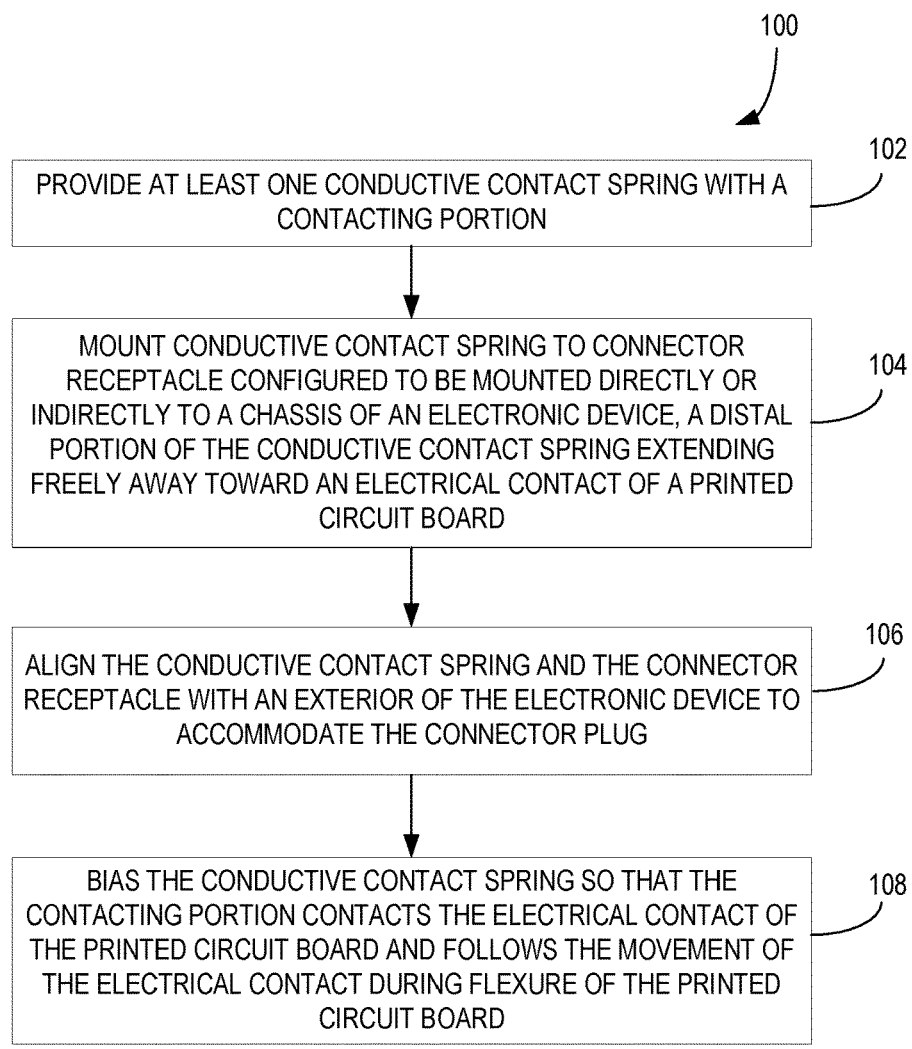
FIG. 11 is a flowchart of a method for manufacturing a connector assembly, according to an example implementation.

FIG. 11 illustrates a method 100 for manufacturing a connector assembly 12. At 102, the method 100 includes providing at least one conductive contact spring 18 with a contacting portion 22. At 104, the method 100 further includes mounting a proximate portion 32 of the conductive contact spring 18 to an electronic component which may be a connector receptacle 14 configured to be mounted directly or indirectly to a chassis 16 of an electronic device 10. The connector receptacle 14 may be further configured to electrically couple to a connector plug 20 inserted in the connector receptacle 14. The proximate portion 32 of the conductive contact spring 18 may extend substantially orthogonally to a distal portion 34 of the conductive contact spring 18. The proximate portion 32 and the distal portion 34 may meet at a location on the connector receptacle 14 and the distal portion 34 may extend freely away from the meeting location toward an electrical contact 24 of a printed circuit board 26.

Accordingly, the connector receptacle 14 may be assembled directly into the chassis 16 with the conductive contact spring 18 angled upward relative to the chassis 16 so that the conductive contact spring 18 contacts the underside of the printed circuit board 26 and interferes with the nominal position of the printed circuit board 26 by between 5-70% of the printed circuit board thickness. One potential advantage of the method 100 as described here is that alignment of connections and assembly thereof do not require the complications of additional supporting components on the printed circuit board 26, connector receptacle 14, conductive contact springs 18, or surrounding areas in the electronic device 10, and the overall height of the assembly can be minimized.

The method 100 at 106 further includes aligning the conductive contact spring 18 and the connector receptacle 14 with an exterior of the electronic device 10 to accommodate the connector plug 20. At 108, the method 100 further includes biasing the conductive contact spring 18 so that the contacting portion 22 contacts the electrical contact 24 of the printed circuit board 26. The contacting portion 22 may follow the movement of the electrical contact 24 during flexure of the printed circuit board 26, an electrical connection formed between the conductive contact spring 18 and the electrical contact 24.

The method 100 may include a plurality of connector plugs 20, the connector receptacle 14 for each connector plug 20 to be aligned with the exterior of the electronic device 10 to accommodate the connector plugs 20. One potential advantage of this configuration is the floating connector assembly 12 may be used in an electronic device having another connector receptacle that is directly mounted to the printed circuit board, in contrast to receptacle 14 which is mounted to the chassis 16. Whereas with prior designs featuring two connectors soldered to a single printed circuit board alignment problems such as discussed above arose, with the present design the floating connector assembly 12 enables both the opening in the housing for the receptacle 14 and the additional connector in this example to be manufactured to tight tolerances. This is possible since the precise positioning of the receptacle 14 is not fixed via solder to the printed circuit board, but rather is mounted directly to the chassis; also the relative position between the receptacle 14 and a receptacle directly soldered to the printed circuit board can be slightly adjusted and accommodated for via the floating connector assembly.

Although the electronic device is depicted in the figures as a tablet computing device, it will be appreciated that the present disclosure is applicable to electronic devices of a variety of types, including laptops, desktops, smartphones, servers, cameras, media players, watches, printers, routers, electronic personal assistant devices, navigation devices, audio video equipment. Virtually any electronic device that contains a printed circuit board and one or more ports could utilize the floating connector assembly 12 disclosed herein.

The implementation of the floating connector assembly 12 is not limited to alignment between connector ports, PCBs, and device chassis. For example, a camera needing precise alignment with a lens within a device may benefit from a floating connector assembly design. In general, the floating connector assembly 12 may apply to any internal component requiring or benefiting from restrained position requirements or mounting to a critical surface.

The following paragraphs provide additional support for the claims of the subject application. One aspect provides an electronic device, comprising an electronic component mounted directly or indirectly to a chassis of the electronic device, at least one conductive contact spring mounted to the electronic component and configured to electrically couple to the electronic component, and a printed circuit board having a fixed end and a free end with an electrical contact positioned therebetween. The conductive contact spring is biased so that a contacting portion of the conductive contact spring contacts the electrical contact and forms an electrical connection, the electrical connection being maintained during relative movement of the conductive contact spring and the electrical contact of the printed circuit board by a bias force of the conductive contact spring.

In this aspect, additionally or alternatively, the printed circuit board may be formed in a horizontal plane, and the conductive contact spring may include a distal portion that extends horizontally away from a housing of the electronic component and toward the electrical contact. In this aspect, additionally or alternatively, the conductive contact spring may include a proximate portion extending substantially orthogonally to the distal portion and may be mounted at a proximal end to the housing of the electronic component. In this aspect, additionally or alternatively, the free end of the printed circuit board may be configured to flex in a direction orthogonal to the horizontal plane when the electronic device is exposed to the influence of external forces.

In this aspect, additionally or alternatively, the contacting portion of the conductive contact spring may be biased to follow the movement of the electrical contact of the printed circuit board during flexure of the printed circuit board. In this aspect, additionally or alternatively, a range of travel of the electrical connection during flexure of the printed circuit board may be zero to 3 mm. In this aspect, additionally or alternatively, an entire length of the distal portion of the conductive contact spring is on a same side of the printed circuit board as the electrical contact.

In this aspect, additionally or alternatively, a nonconductive tray may include the housing of the electronic component, and a proximate portion of the conductive contact spring and the distal portion may meet at a location on a surface of the tray. In this aspect, additionally or alternatively, the distal portion of the conductive contact spring may extend freely from the meeting location to an elevation vertically away from the surface of the tray. In this aspect, additionally or alternatively, the electrical contact may be flush with a lower or upper surface of the printed circuit board, and the electrical contact and the contacting portion may be gold plated. In this aspect, additionally or alternatively, the conductive contact spring may exert at least 30 gf of bias force against the electrical contact of the printed circuit board to maintain the electrical connection.

In this aspect, additionally or alternatively, the conductive contact spring may be one of a plurality of conductive contact springs, and a number of the plurality of conductive contact springs may total one, five, twelve, or twenty. In this aspect, additionally or alternatively, the electronic component may be a connector receptacle, and the contact spring may be configured to electrically couple to a connector plug inserted in the connector receptacle. In this aspect, additionally or alternatively, the connector receptacle may have a shape selected from at least one of the group consisting of an audio connector jack, UNIVERSAL SERIAL BUS receptacle, MINI DISPLAYPORT receptacle, FIREWIRE receptacle, Ethernet receptacle, HDMI receptacle, SURFACE CONNECT receptacle, and customer-specific implementations. In this aspect, additionally or alternatively, a mounting point of the conductive contact spring may be in a plane perpendicular to the plane of the electrical connection and along a proximate portion of the conductive contact spring.

Another aspect provides a connector assembly comprising a connector receptacle configured to be mounted directly or indirectly to a chassis of an electronic device and at least one conductive contact spring mounted to the connector receptacle and configured to electrically couple to a connector plug inserted in the connector receptacle. The conductive contact spring is biased so that a contacting portion of the conductive contact spring contacts an electrical contact of a printed circuit board of the electronic device and forms an electrical connection, the electrical connection being maintained during relative movement of the conductive contact spring and the electrical contact of the printed circuit board by a bias force of the conductive contact spring.

In this aspect, additionally or alternatively, the printed circuit board may be formed in a horizontal plane, and the conductive contact spring may include a distal portion that extends horizontally away from a housing of the connector receptacle and toward the electrical contact. In this aspect, additionally or alternatively, the contacting portion of the conductive contact spring may be biased to follow the movement of the electrical contact of the printed circuit board during flexure of the printed circuit board.

Another aspect provides a method for manufacturing a connector assembly, the method comprising providing at least one conductive contact spring with a contacting portion and mounting a proximate portion of the conductive contact spring to a connector receptacle configured to be mounted directly or indirectly to a chassis of an electronic device. The connector receptacle is further configured to electrically couple to a connector plug inserted in the connector receptacle, the proximate portion of the conductive contact spring extending substantially orthogonally to a distal portion of the conductive contact spring, the proximate portion and the distal portion meeting at a location on the connector receptacle and the distal portion extending freely away from the meeting location toward an electrical contact of a printed circuit board. The method comprises aligning the conductive contact spring and the connector receptacle with an exterior of the electronic device to accommodate the connector plug, and biasing the conductive contact spring so that the contacting portion contacts the electrical contact of the printed circuit board and follows the movement of the electrical contact during flexure of the printed circuit board, an electrical connection formed between the conductive contact spring and the electrical contact.

In this aspect, additionally or alternatively, may be a plurality of connector plugs; the connector receptacle for each connector plug may be aligned with the exterior of the electronic device to accommodate the connector plugs.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic device, comprising:
an electronic component mounted directly or indirectly to a chassis of the electronic device;
at least one conductive contact spring mounted to the electronic component and configured to electrically couple to the electronic component; and
a printed circuit board having a fixed end and a free end with an electrical contact positioned therebetween, the conductive contact spring being biased so that a contacting portion of the conductive contact spring contacts the electrical contact and forms an electrical connection, the electrical connection being maintained during relative movement of the conductive contact spring and the electrical contact of the printed circuit board by a bias force of the conductive contact spring, wherein
the printed circuit board is formed in a horizontal plane, and
the conductive contact spring includes a distal portion that extends horizontally away from a housing of the electronic component and toward the electrical contact.

2. The electronic device of claim 1, wherein the conductive contact spring includes a proximate portion extending substantially orthogonally to the distal portion and is mounted at a proximal end to the housing of the electronic component.

3. The electronic device of claim 1, wherein the free end of the printed circuit board is configured to flex in a direction orthogonal to the horizontal plane when the electronic device is exposed to the influence of external forces.

4. The electronic device of claim 1, wherein the contacting portion of the conductive contact spring is biased to follow the movement of the electrical contact of the printed circuit board during flexure of the printed circuit board.

5. The electronic device of claim 1, wherein a range of travel of the electrical connection during flexure of the printed circuit board is zero to 3 mm.

6. The electronic device of claim 1, wherein an entire length of the distal portion of the conductive contact spring is on a same side of the printed circuit board as the electrical contact.

7. The electronic device of claim 1, further comprising a nonconductive tray including the housing of the electronic component, a proximate portion of the conductive contact spring and the distal portion meeting at a location on a surface of the tray.

8. The electronic device of claim 7, the distal portion of the conductive contact spring extending freely from the meeting location to an elevation vertically away from the surface of the tray.

9. The electronic device of claim 1, wherein the electrical contact is flush with a lower or upper surface of the printed circuit board, and wherein the electrical contact and the contacting portion are gold plated.

10. The electronic device of claim 1, wherein the conductive contact spring exerts at least 30 gf of bias force against the electrical contact of the printed circuit board to maintain the electrical connection.

11. The electronic device of claim 1, wherein the conductive contact spring is one of a plurality of conductive contact springs, and a number of the plurality of conductive contact springs totals one, five, twelve, or twenty.

12. The electronic device of claim 11, wherein the electronic component is a connector receptacle, and the contact spring is configured to electrically couple to a connector plug inserted in the connector receptacle.

13. The electronic device of claim 12, wherein the connector receptacle has a shape selected from at least one of the group consisting of an audio connector jack, UNIVERSAL SERIAL BUS receptacle, MINI DISPLAYPORT receptacle, FIREWIRE receptacle, Ethernet receptacle, HDMI receptacle, SURFACE CONNECT receptacle, and customer-specific implementations.

14. The electronic device of claim 1, wherein a mounting point of the conductive contact spring is in a plane perpendicular to the plane of the electrical connection and along a proximate portion of the conductive contact spring.

15. A connector assembly, comprising:
a connector receptacle configured to be mounted directly or indirectly to a chassis of an electronic device; and
at least one conductive contact spring mounted to the connector receptacle and configured to electrically couple to a connector plug inserted in the connector receptacle;
the conductive contact spring being biased so that a contacting portion of the conductive contact spring contacts an electrical contact of a printed circuit board of the electronic device and forms an electrical connection, the electrical connection being maintained during relative movement of the conductive contact spring and the electrical contact of the printed circuit board by a bias force of the conductive contact spring, wherein
the printed circuit board is formed in a horizontal plane, and
the conductive contact spring includes a distal portion that extends horizontally away from a housing of the connector receptacle and toward the electrical contact.

16. The connector assembly of claim 15, wherein the contacting portion of the conductive contact spring is biased to follow the movement of the electrical contact of the printed circuit board during flexure of the printed circuit board.

17. A method for manufacturing a connector assembly, the method comprising:
providing at least one conductive contact spring with a contacting portion;
mounting a proximate portion of the conductive contact spring to a connector receptacle configured to be mounted directly or indirectly to a chassis of an electronic device, the connector receptacle further configured to electrically couple to a connector plug inserted in the connector receptacle, the proximate portion of the conductive contact spring extending substantially orthogonally to a distal portion of the conductive contact spring, the proximate portion and the distal portion meeting at a location on the connector receptacle and the distal portion extending freely away from the meeting location toward an electrical contact of a printed circuit board;
aligning the conductive contact spring and the connector receptacle with an exterior of the electronic device to accommodate the connector plug; and
biasing the conductive contact spring so that the contacting portion contacts the electrical contact of the printed circuit board and follows the movement of the electrical contact during flexure of the printed circuit board, an electrical connection formed between the conductive contact spring and the electrical contact.

18. The method of claim 17, further comprising a plurality of connector plugs, wherein the connector receptacle for each connector plug is aligned with the exterior of the electronic device to accommodate the connector plugs.

* * * * *